(12) United States Patent
Bassom et al.

(10) Patent No.: US 11,170,967 B2
(45) Date of Patent: Nov. 9, 2021

(54) LIQUID METAL ION SOURCE

(71) Applicant: Axcelis Technologies, Inc., Beverly, MA (US)

(72) Inventors: Neil Bassom, Hamilton, MA (US); Neil Colvin, Merrimack, NH (US); Tseh-Jen Hsieh, Rowley, MA (US); Michael Ameen, Newburyport, MA (US)

(73) Assignee: AXCELIS TECHNOLOGIES, INC., Beverly, MA (US)

( * ) Notice: Subject to any disclaimer, the term of this patent is extended or adjusted under 35 U.S.C. 154(b) by 0 days.

(21) Appl. No.: 16/824,069

(22) Filed: Mar. 19, 2020

(65) Prior Publication Data

US 2020/0303154 A1    Sep. 24, 2020

Related U.S. Application Data

(60) Provisional application No. 62/822,313, filed on Mar. 22, 2019.

(51) Int. Cl.
*H01J 37/08* (2006.01)
*H01J 37/30* (2006.01)
(Continued)

(52) U.S. Cl.
CPC ............. *H01J 37/08* (2013.01); *H01J 27/02* (2013.01); *H01J 37/3002* (2013.01); *H01J 49/10* (2013.01); *H01J 2237/0805* (2013.01)

(58) Field of Classification Search
CPC ........ H01J 37/08; H01J 37/3002; H01J 27/02; H01J 49/10; H01J 2237/08; H01J 2237/0805
See application file for complete search history.

(56) References Cited

U.S. PATENT DOCUMENTS 4,152,478 A     5/1979  Takagi
10,163,602 B2 * 12/2018 Shichi ................ H01J 37/28
(Continued)

FOREIGN PATENT DOCUMENTS

JP    H04306540 A    10/1992
JP    H0554810 A     3/1993
(Continued)

OTHER PUBLICATIONS

Feng Y C et al; "A novel metal ion source for preparing hard coatings"; Nuclear Instruments and Methods in Physics Research. Section B: Beam Interactions with Materials and Atoms; vol. 149. No. 1; Jan. 3, 1999.

(Continued)

*Primary Examiner* — Amy Cohen Johnson
*Assistant Examiner* — Syed M Kaiser
(74) *Attorney, Agent, or Firm* — Eschweiler & Potashnik, LLC

(57) ABSTRACT

An ion source is configured to form an ion beam and has an arc chamber enclosing an arc chamber environment. A reservoir apparatus can be configured as a repeller and provides a liquid metal to the arc chamber environment. A biasing power supply electrically biases the reservoir apparatus with respect to the arc chamber to vaporize the liquid metal to form a plasma in the arc chamber environment. The reservoir apparatus has a cup and cap defining a reservoir environment for the liquid metal that is fluidly coupled to the arc chamber environment by holes in the cap. Features extend from the cup into the reservoir and contact the liquid metal to feed the liquid metal toward the arc chamber environment by capillary action. A structure, surface area, roughness, and material modifies the capillary action. The feature can be an annular ring, rod, or tube extending into the liquid metal.

20 Claims, 8 Drawing Sheets

(51) Int. Cl.
*H01J 49/10* (2006.01)
*H01J 27/02* (2006.01)

(56) References Cited

U.S. PATENT DOCUMENTS

| | | | |
|---|---|---|---|
| 10,600,611 B2* | 3/2020 | Becker | H01J 37/32055 |
| 2008/0217555 A1* | 9/2008 | Ward | H01J 27/26 250/423 F |
| 2011/0253891 A1* | 10/2011 | Hashimoto | H01J 49/0013 250/288 |
| 2012/0048723 A1* | 3/2012 | Chaney | H01J 37/3171 204/192.11 |
| 2013/0313971 A1 | 11/2013 | Biloiu | |
| 2015/0047079 A1* | 2/2015 | Kozakai | H01J 37/3002 850/26 |
| 2017/0148617 A1* | 5/2017 | Akiyama | H01J 49/0009 |
| 2018/0005793 A1* | 1/2018 | Chaney | H01J 27/16 |
| 2019/0180971 A1* | 6/2019 | Becker | H01J 37/3438 |
| 2020/0090916 A1* | 3/2020 | Patel | H01J 37/32055 |
| 2020/0294776 A1* | 9/2020 | Kawanami | H01J 37/32834 |

FOREIGN PATENT DOCUMENTS

| | | |
|---|---|---|
| JP | H0554812 A | 3/1993 |
| JP | H06325713 A | 11/1994 |
| JP | 2004139913 A | 5/2004 |

OTHER PUBLICATIONS

Ensinger W; "Ion Sources for Ion Beam Assisted Thin-Film Deposition"; Review of Scientific Instruments; AIP vol. 63, No. 11; Melville, NY; Nov. 1, 1992.

International Search Report and Written Opinion dated Jul. 17, 2020 in connection with PCT/US2020/023664.

* cited by examiner

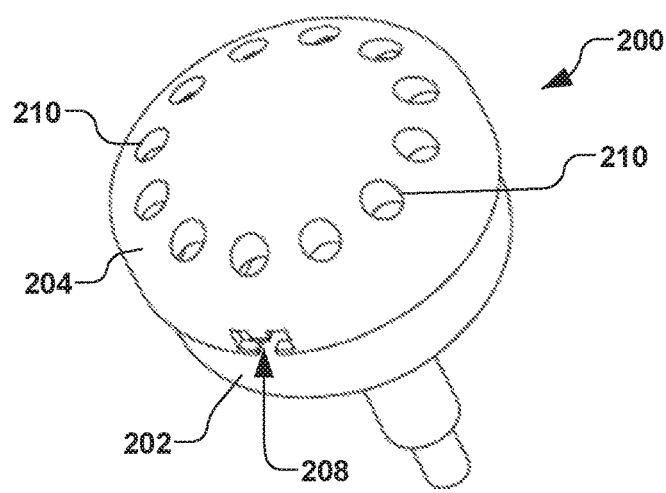
FIG. 5A
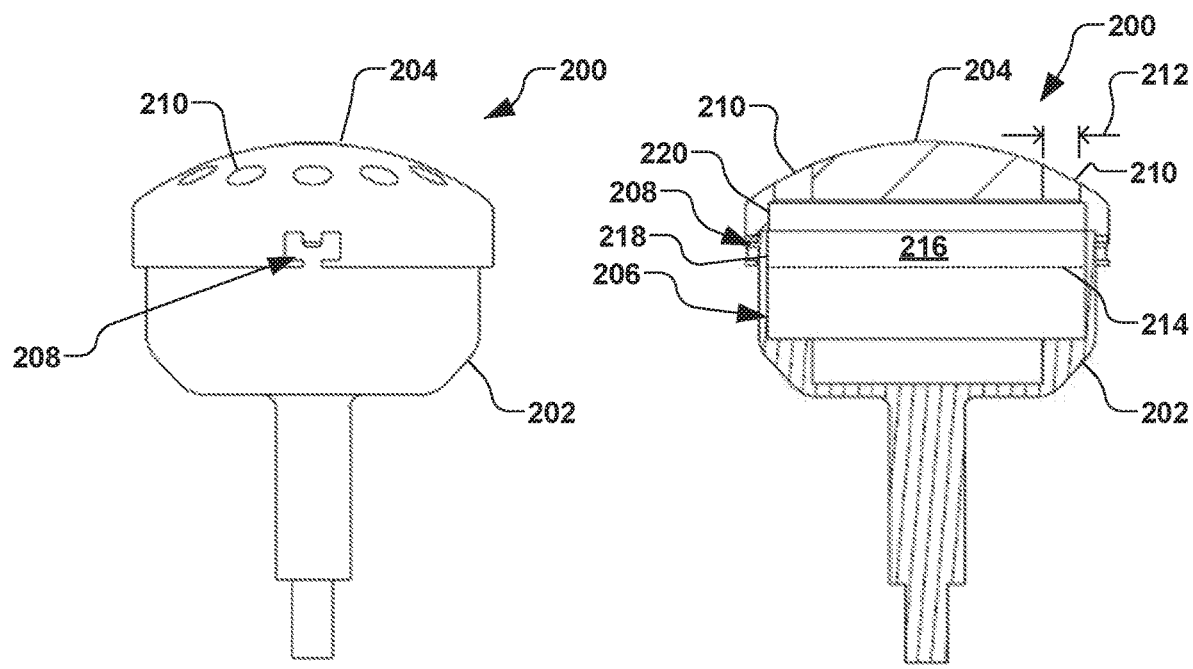
FIG. 5B
FIG. 5C

LIQUID METAL ION SOURCE

REFERENCE TO RELATED APPLICATIONS

This application claims the benefit of U.S. Provisional Application No. 62/822,313 filed Mar. 22, 2019, entitled "LIQUID METAL ION SOURCE", the contents of which are herein incorporated by reference in their entirety.

TECHNICAL FIELD

The present invention relates generally to ion implantation systems, and more specifically to apparatuses, systems and methods for providing source material for an ion source.

BACKGROUND

There is increasing demand for ion implants using metal ions. For example, aluminum implants are important for the power device market, which is a small but very fast growing segment of the market. For many metals, including aluminum, supplying feed material to the ion source is problematic. While gas molecules containing aluminum or other metals may be utilized, the metal atom(s) tend to be attached to carbon and/or hydrogen, which can cause problems in the ion source. Systems have been previously provided that utilize a vaporizer, which is a small oven that is external to the arc chamber of the ion source, whereby metal salts are heated to produce adequate vapor pressure to supply vapor to the ion source. The oven, however, is remote from the arc chamber and takes time to heat up to the desired temperature, establish the vapor flow, start the plasma, start the ion beam, etc. Further, if a change from one metal species to some other species is desired, time is taken in waiting for the oven to cool down adequately for such a change in species.

Another conventional technique is to place a metal-containing material such as aluminum or another metal inside the arc chamber. For aluminum, the metal-containing material may comprise aluminum oxide, aluminum fluoride, or aluminum nitride, all of which can withstand the approximately 800 C temperatures of the plasma chamber. In such a system, ions are sputtered directly off the material in the plasma. Another technique is to use a plasma containing an etchant such as fluorine to attain chemical etching of the metal. While acceptable beam currents can be attained using these various techniques, compounds of aluminum oxide, aluminum chloride, and aluminum nitride, all of which are good electrical insulators, tend to be deposited on electrodes adjacent to the ion source in a relatively short period of time (e.g., 5-10 hours). As such, various deleterious effects are seen, such as high voltage instabilities and associated variations in dosage of ions being implanted.

SUMMARY

Aspects of the disclosure facilitate ion implantation processes for increasing a length of usage of an ion source of an ion implantation system between preventive maintenance cycles, thus increasing overall productivity and lifetime of the ion implantation system.

In accordance with one example, an ion source is provided and configured to form an ion beam, wherein the ion source comprises an arc chamber generally enclosing an arc chamber environment. A reservoir apparatus is further provided and configured to provide a liquid metal to the arc chamber environment. A biasing power supply is further configured to electrically bias the reservoir apparatus with respect to the arc chamber. The reservoir apparatus, for example, comprises a cup configured to generally contain the liquid metal therein. The cup, for example, is configured to generally contain the liquid metal therein by gravity.

In one example aspect, the reservoir apparatus further comprises a cap, wherein the cap is in selective engagement with the cup and generally encloses a top portion of the reservoir apparatus, therein defining a reservoir environment associated with the liquid metal. The liquid metal, for example, resides in the reservoir environment, and wherein the reservoir apparatus is further configured to selectively evaporate at least a portion of the liquid metal therein. The reservoir apparatus, for example, is configured to selectively evaporate the at least a portion of the liquid metal by a selective heating of the introduction apparatus via a heat source.

In one example, the heat source comprises one or more of a plasma generated within the arc chamber, an energy associated with the ions from the plasma striking the reservoir apparatus, and an auxiliary heater.

In another example aspect, the cap comprises one or more holes defined therein, wherein the one or more holes provide the fluid communication between the reservoir environment and the arc chamber environment. In one example, the cap further comprises one or more features extending into the reservoir, wherein the one or more features are configured to contact the liquid metal within the reservoir and to feed the liquid metal toward the arc chamber environment via capillary action. The one or more features, for example, comprise one or more of a predetermined surface area, surface roughness, and surface material configured to provide the capillary action. In another example, the one or more features comprise one or more of an annular feature extending from the cap into the reservoir, a reservoir feature extending from the reservoir toward the cap, and an elongate feature extending from a central portion of the cap into liquid metal within the reservoir.

In accordance with another aspect of the disclosure, an arc chamber is provided for forming an ion beam, wherein the arc chamber comprises a housing generally enclosing an arc chamber environment. A reservoir apparatus, for example, is positioned within the arc chamber environment, wherein the reservoir apparatus is configured to contain a liquid metal in the arc chamber environment. Further, a biasing power supply is provided and configured to electrically bias the reservoir apparatus and to form a plasma within the arc chamber environment.

In one example, the reservoir apparatus comprises a cup and a cap, wherein the cup is configured to at least partially contain the liquid metal therein, and wherein the cap is in selective engagement with the cup and generally encloses a top portion of the reservoir apparatus, therein defining a reservoir environment associated with the liquid metal. The liquid metal, for example, resides in the reservoir environment, wherein the reservoir apparatus is further configured to selectively evaporate at least a portion of the liquid metal therein.

In another example, the reservoir apparatus is configured to selectively evaporate the at least a portion of the liquid metal by a selective heating of the reservoir apparatus via a heat source, wherein the heat source comprises one or more of a plasma generated within the arc chamber, an energy associated with the ion beam, and an auxiliary heater.

The cap, for example, can comprise one or more holes therein, wherein the one or more holes provide the fluid communication between the reservoir environment and the arc chamber environment, and wherein the one or more holes have one or more diameters, and wherein the one or more holes are oriented such that a plasma in the arc chamber does not have direct contact with the liquid metal in the reservoir.

In another example, the cap can further comprise one or more features extending into the cup, wherein the one or more features are configured to contact the liquid metal within the reservoir and to feed the liquid metal toward the arc chamber environment via capillary action. The one or more features, for example, can comprise one or more of an annular ring defined in the cap, wherein the annular lip extends from a main portion of the cap into liquid metal within the reservoir. In another example, the one or more features comprise an elongate feature extending from the main portion of the cap into liquid metal within the reservoir.

In yet another example aspect of the disclosure, a method for forming an ion beam is provided, wherein an elemental metal is provided to an interior environment of an arc chamber and heated to a liquid state. The elemental metal is further vaporized and energized to form metal ions within the arc chamber.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

BRIEF DESCRIPTION OF THE DRAWINGS

FIG. 5A is a perspective view of a reservoir apparatus having a cap in accordance with various examples of the present disclosure.

FIG. 5B is a side view of the reservoir apparatus of FIG. 5A in accordance with various examples of the present disclosure.

FIG. 5C is a cross-sectional view of the reservoir apparatus of FIG. 5A in accordance with various examples of the present disclosure.

DETAILED DESCRIPTION

Figure 1:
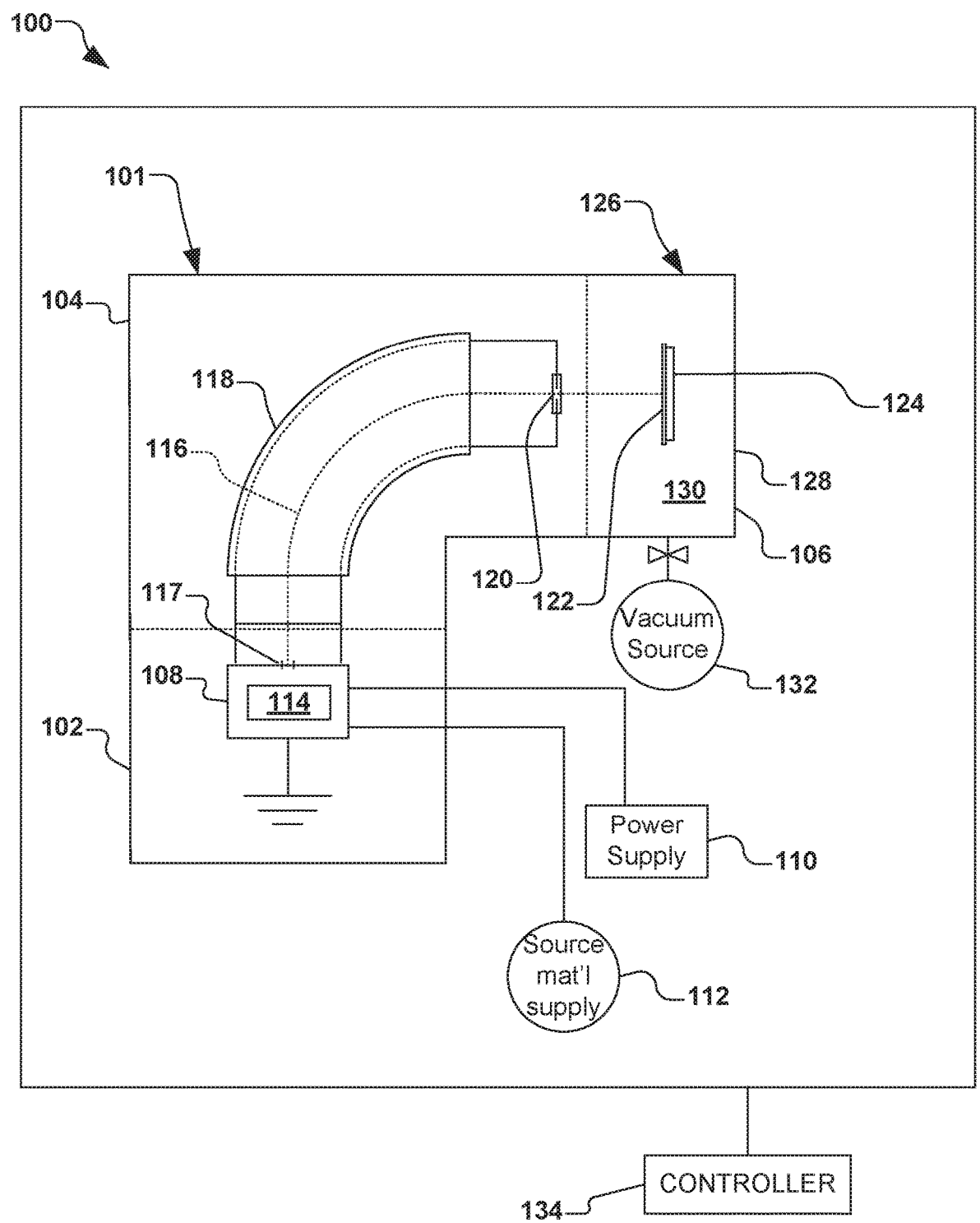
FIG. 1 is a block diagram of an exemplary vacuum system in accordance with several aspects of the present disclosure.

The present disclosure is directed generally toward various apparatuses, systems, and methods associated with implantation of ions into a workpiece. More specifically, the present disclosure is directed to an ion source configured to provide a liquid metal within an arc chamber for extraction of ions therefrom.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the workpiece with impurities of a specified dopant material, at a predetermined energy level, and in controlled concentration, to produce a desired semiconductor material during fabrication of an integrated circuit. When used for doping a semiconductor wafer, for example, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

An ion implanter includes an ion source, an ion extraction device, a mass analysis device, a beam transport device and a workpiece processing device. The ion source generates ions of desired atomic or molecular dopant species. These ions are extracted from the ion source by an extraction system, such as a set of electrodes which energize and direct the flow of ions from the ion source, forming an ion beam. Desired ions are separated from the ion beam in a mass analysis device, such as a magnetic dipole that performs mass dispersion or separation of the extracted ion beam. The beam transport device, such as a vacuum system containing a series of focusing devices, transports the ion beam to the workpiece processing device while maintaining desired properties of the ion beam. Finally, workpieces such as semiconductor wafers are transferred in to and out of the workpiece processing device via a workpiece handling system, which may include one or more robotic arms for placing a workpiece to be treated in front of the ion beam and removing the treated workpiece from the ion implanter.

The present disclosure, for example, provides advantages over conventional ion sources that use aluminum or other metal elements or compounds as sputter targets within the conventional ion source or as feeds in a vaporizer using an aluminum iodide, aluminum chloride, or other metal compounds, where such conventional approaches have low beam currents and introduce atoms other than the desired dopant into the plasma within the conventional ion source.

Conventionally, ion implanters are utilized to implant a wide variety of species. If gaseous precursors are available, such precursors are generally preferred, as they offer relatively fast switching between species, as well as minimizing deposition of material inside the arc chamber that risk cross-contamination when other species are run. For some materials, such as gallium, indium, and aluminum, however, convenient gaseous precursors are not conventionally available. In such cases, a vaporizer system is used to supply a vapor containing the target atom to the ion source. Materials are selected that have a vapor pressure in the range of approximately 1 mtorr-1 torr at temperatures in the approximate range of 100 C-800 C, and the materials are conventionally heated in an oven external to an arc chamber of the ion source. The oven is in communication with the arc chamber through a nozzle, whereby the vapor flows from the oven to the arc chamber. Such systems, however, tend to exhibit long periods of time to transition between species being vaporized, as the oven and nozzle system have a high thermal mass and long settling time.

As an alternative, a solid target containing the atom can be placed inside the arc chamber at the repeller end and/or on a sidewall, so that a plasma formed within the arc chamber sputters material from the solid target into the plasma. Such sputtering can be enhanced by a chemical effect by introducing a fluorine-containing gas or other reactive gas into the plasma. The range of available materials is limited, however, as they should withstand the 600C-1000 C temperatures seen in the arc chamber without melting or subliming. Most such materials, particularly for the technologically interesting metals gallium and aluminum, for example, are oxides, fluorides, or nitrides. These materials, when combined with the reactive gas, may result in the deposition of insulating compounds on high voltage electrodes used to extract and shape the ion beam to be drawn from the ion source. Such depositions can cause high voltage instabilities and a shortened lifetime of the ion source. In addition, the solid target is exposed to the plasma even when other species are being extracted, resulting in contamination of the extracted beam and wear of the solid target. The present disclosure, however, presently appreciates advantages in providing a pure source of the dopant species to the plasma to provide a relatively short time to turn-on and turn-off the ion source.

In accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110, whereby a source material 112 (also called a dopant material) is supplied to an arc chamber 114 and is ionized into a plurality of ions to form and extract an ion beam 116 through an extraction aperture 117. The ion beam 116 in the present example is directed through a beam-steering apparatus 118 (also called a source magnet), and out an aperture 120 towards the end station 106. In the end station 106, the ion beam 116 bombards a workpiece 122 (e.g., a semiconductor such as a silicon wafer, a display panel, etc.), which is selectively clamped or mounted to a chuck 124 (e.g., an electrostatic chuck or ESC). Once embedded into the lattice of the workpiece 122, the implanted ions change the physical and/or chemical properties of the workpiece. Because of this, ion implantation is used in semiconductor device fabrication and in metal finishing, as well as various applications in materials science research.

The ion beam 116 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 126, such as a vacuum chamber 128, wherein a process environment 130 is associated with the process chamber. The process environment 130 generally exists within the process chamber 126, and in one example, comprises a vacuum produced by a vacuum source 132 (e.g., a vacuum pump) coupled to the process chamber and configured to substantially evacuate the process chamber. Further, a controller 134 is provided for overall control of the vacuum system 100 and components, thereof.

It shall be understood that the apparatus of the present disclosure may be implemented in other semiconductor processing equipment such as CVD, PVD, MOCVD, etching equipment, and various other semiconductor processing equipment, and all such implementations are contemplated as falling within the scope of the present disclosure. The apparatus of the present disclosure advantageously increases the length of usage of the ion source 108 between preventive maintenance cycles, and thus increases overall productivity and lifetime of the system vacuum 100.

The ion source 108 (also called an ion source chamber), for example, can be constructed using refractory metals (W, Mo, Ta, etc.) and graphite in order to provide suitable high temperature performance, whereby such materials are generally accepted by semiconductor chip manufacturers. In accordance with the present disclosure, the source material 112 comprises, or is comprised of, a metal (e.g., aluminum, gallium, indium, or other metal) that is advantageously provided within the ion source 108 (e.g., in the arc chamber 114) in a liquid state.

Figure 2:
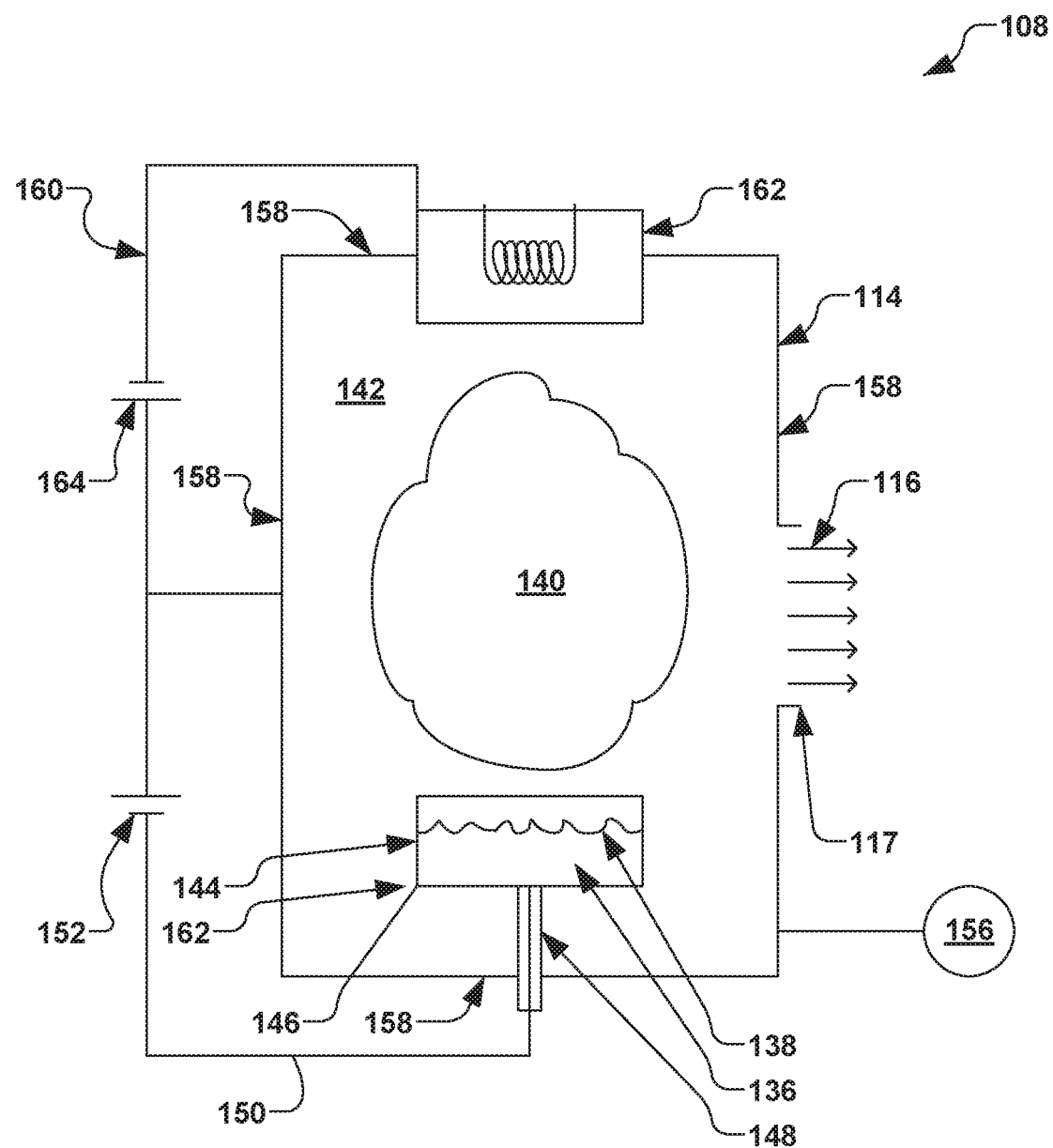
FIG. 2 is a schematic representation of an ion source in accordance with one example of the present disclosure.

The arc chamber 114 of the ion source 108, for example, is schematically illustrated in FIG. 2, whereby the ion source of the present disclosure can be configured to provide the ion beam 116 having a high beam current by using evaporation from a metal source material 136 such as aluminum, indium, gallium, antimony, or other metal.

Figure 3A:
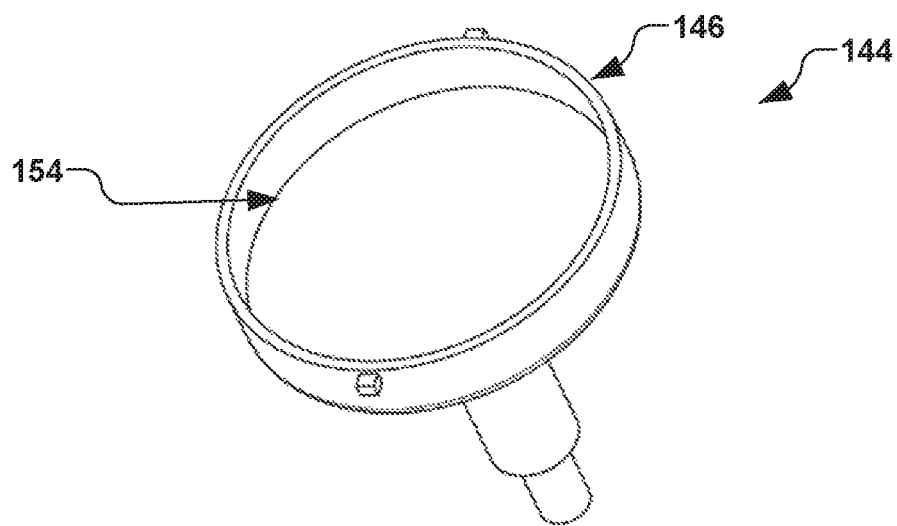
FIG. 3A is a perspective view of a reservoir apparatus for containing a liquid metal in accordance with various examples of the present disclosure.
Figure 3B:
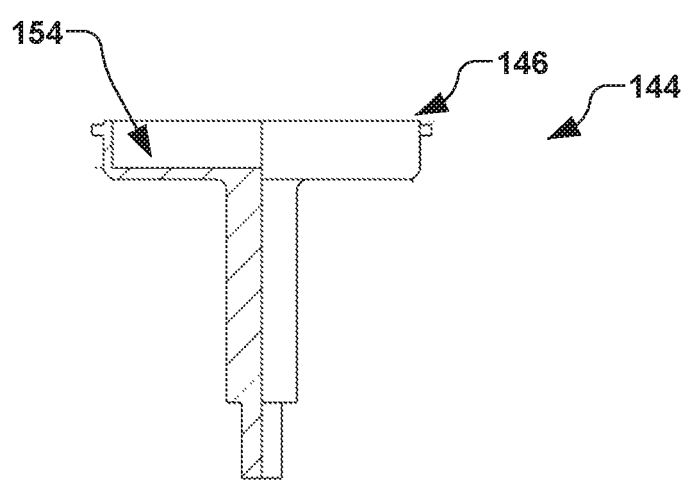
FIG. 3B is a partial cross-sectional view of the reservoir apparatus of FIG. 3A in accordance with various examples of the present disclosure.

The metal source material 136 is heated within the arc chamber 114 to form or otherwise maintain a liquid state, therein defining a liquid metal 138, and wherein the liquid metal is further vaporized within the arc chamber for forming a plasma 140. The liquid metal 138, for example, may be exposed directly to an arc chamber environment 142 in which the plasma 140 is formed. Alternatively or additionally, the present disclosure can provide capillary action to draw the liquid metal 138 to be exposed to the plasma 140, where it is incorporated into the plasma through physical or chemical action, as will be further discussed infra. The metal source material 136 (e.g., the liquid metal 138), for example, may be retained or otherwise contained or held in a reservoir apparatus 144. The reservoir apparatus 144, for example, comprises a cup 146 defined in a repeller 148 of the ion source 108, whereby the cup is negatively biased with respect to the arc chamber 114 by a bias voltage 150 (e.g., 0-500V) provided by a repeller power supply 152. For example, the bias voltage 150 (e.g., a repeller supply voltage) can be altered in response to changes in the arc current, extraction current, or other factors for control purposes. FIGS. 3A-3B illustrate an example reservoir apparatus 144, wherein the metal source material 136 can be contained within a recess 154 of the cup 146. In one example, a geometry of the arc chamber 114 of the ion source 108 of FIG. 2 is provided such that the liquid metal 138 is retained in the cup 146 by gravity and is not tilted or spilled during an operation of the ion source 108.

In accordance with one example, by varying the bias voltage 150, input parameters to the source magnet 118 of FIG. 1, and/or other parameters associated with the plasma 140 of FIG. 2, an amount of power from the plasma can be controlled and provided to the liquid metal 138, thus raising its temperature high enough for a vapor pressure to sustain the plasma within the arc chamber 114. A support gas 156, for example, can be optionally introduced to the arc chamber 114 to further sustain the plasma 140, whereby the support gas may be inert (e.g., argon) or chemically reactive (e.g., fluorine, chlorine) with the source material 136. The bias voltage 150, for example, can also serve to provide direct sputtering of the source material 136, such as through bombardment by the support gas 156. The support gas 156, for example, can further increase efficiency of the ion source 108 by sputtering material that condenses on one or more walls 158 (also called sidewalls) that generally enclose the arc chamber 114 and convert the sputtered material back into the plasma 140. The bias voltage 150, for example, can be further provided, controlled, or augmented by an arc voltage 160 (e.g., 0-150V) applied to a cathode 162 of the ion source 108, or may be alternatively provided by a cathode power supply 164.

The reservoir apparatus 144 (e.g., a crucible) of the present disclosure thus provides advantages over conventional systems, whereby the reservoir apparatus, for example, can be provided in one or more of a repeller position 166 associated with the repeller 148 and a sidewall 158 of the arc chamber 114 of the ion source 108, wherein the reservoir apparatus is configured to generally hold or contain the source material 136 in the form of the liquid metal 138 described above.

Figure 4:
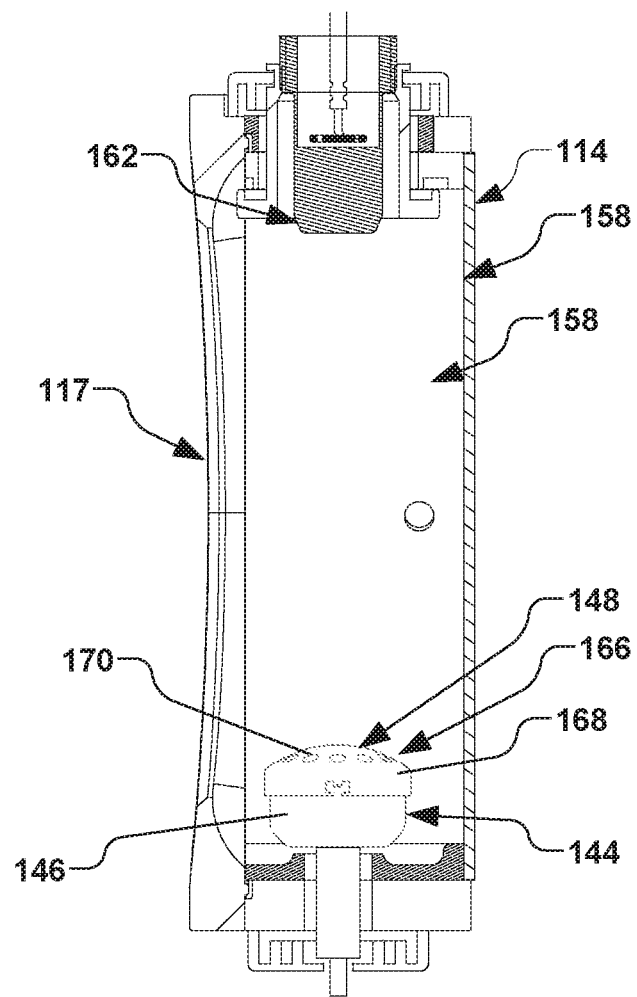
FIG. 4 is a partial cross-sectional view of an arc chamber of an ion source in accordance with various examples of the present disclosure.

FIG. 4 illustrates another example of the arc chamber 114 in accordance with another aspect of the present disclosure. In the example shown in FIG. 4, the reservoir apparatus 144 within the arc chamber 114 comprises further comprise a cap 168 (also called a lid) generally covering the cup 146, wherein the reservoir apparatus is located in the repeller position 166 of the arc chamber. The reservoir apparatus 144 shown in FIG. 4, for example, can be utilized as the repeller 148 as discussed above in reference to FIG. 2, or alternatively, the reservoir apparatus can be implemented without coupling to a power supply, but simply located in the repeller position 166 of the arc chamber 114. The arc chamber 114 of FIG. 4, for example, can be advantageously implemented in the "Purion" ion implantation system manufactured by Axcelis Technologies, Inc. of Beverly, Mass., whereby the reservoir apparatus 144 can be vertically oriented at a bottom of a vertically-aligned ion source. The cap 168, for example, comprises one or more holes 170, whereby the holes are configured and oriented such that the plasma 140 in the ion source 108 of FIG. 2 does not directly contact with the source material 136 held in the cup 146.

For example, FIGS. 5A-5C illustrate a reservoir apparatus 200, wherein the reservoir apparatus can be configured in a manner similar to the reservoir apparatus 144. The reservoir apparatus 200 of FIGS. 5A-5C, for example, comprises a cup 202 having a cap 204 operably coupled thereto, wherein a recess 206 shown in FIG. 5C is configured to generally hold or confine the liquid metal 138 (e.g., originally in solid form such as solid aluminum in powder form) shown in FIG. 2. The cap 204 of FIGS. 5A-5C, for example, can rest on, or be otherwise secured to, the cup 202, such as via one or more securement features 208 (e.g., one or more slots, pins, clamps, etc.) associated with one or more of the cup and cap, thereby generally covering the recess 206. The recess 206 can have varying diameters. The reservoir apparatus 200, for example, can be filled with, or otherwise contain, the one or more source materials 136 of FIG. 2 in a liquid state, whereby the one or more source materials have a low vapor pressure (e.g., <1 mtorr) at temperatures experienced by the repeller 148 (e.g., approximately 800 C). Again, such materials, for example, can include, but are not limited to, aluminum, gallium, and indium.

The cap 204 of FIGS. 5A-5C, for example, can further comprise one or more holes 210 defined in the cap, wherein the one or more holes are configured to provide exposure of the recess 206 to the arc chamber environment 142 of FIG.

2. Layout and configuration of the one or more holes 210 in the cap 204 of FIGS. 5A-5C, for example, can be selected to be any number, location, and size, such as having one or more diameters 212 shown in FIG. 5C, whereby the layout and configuration can be based on a desired amount of vapor that can be transmitted through the one or more holes. The reservoir apparatus 200, for example, can be configured such that the metal source material 136 of FIG. 2 is generally maintained at a level 214, such the liquid metal 138 generally fills the recess 206 in the cup 202 to the level. As such, a cavity 216 shown in FIG. 5C above the level 214 of the metal source material 136, for example, can be can be configured to provide head space for vapor pressure to build and subsequently diffuse out of the one or more holes 210 on the cap 204 to form the plasma 140 of FIG. 2. The respective cup 202 and cap 204, for example is further configured to provide for wicking along sidewalls 218, 220 and/or vaporization within the cavity 216.

Figure 6A:
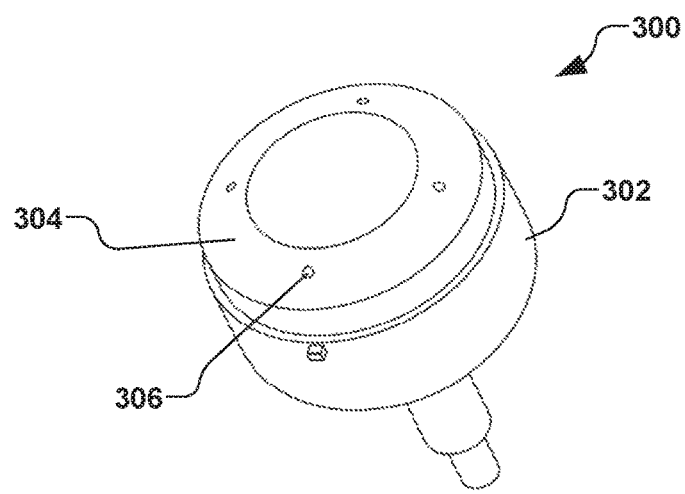
FIG. 6A is a perspective view of another reservoir apparatus having a cap in accordance with various examples of the present disclosure.
Figures 6B, 6C:
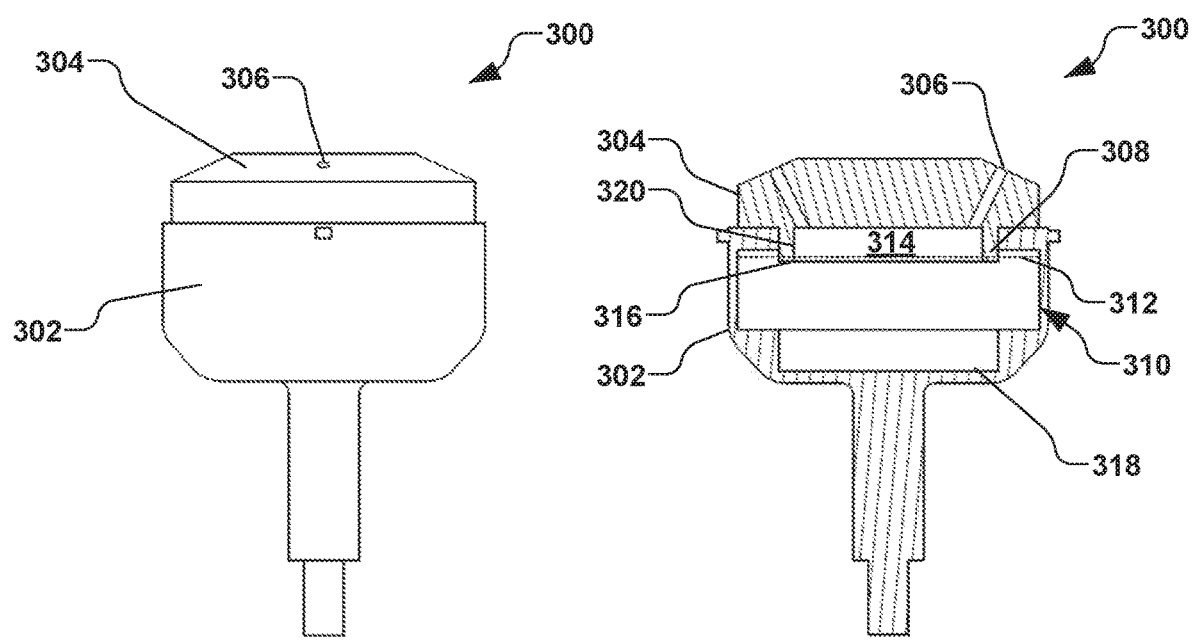
FIG. 6B is a side view of the reservoir apparatus of FIG. 6A in accordance with various examples of the present disclosure.
FIG. 6C is a cross-sectional view of the reservoir apparatus of FIG. 6A in accordance with various examples of the present disclosure.

In another example shown in FIGS. 6A-6C, another example of a reservoir apparatus 300 is illustrated, wherein the reservoir apparatus can again be configured in a manner similar to the reservoir apparatus 144 of FIG. 2. For example, the reservoir apparatus 300 of FIGS. 6A-6C can be implemented as the repeller 148 of FIG. 2, whereby the metal source material 136 is liquefied and subsequently transitioned to vapor phase. For example, the reservoir apparatus 300 of FIG. 6C is illustrated comprising a cup 302 and a cap 304, wherein the cap comprises one or more holes 306. The one or more holes 306 shown in the example of FIG. 6C are further angled. Further, the cap 304, for example, comprises one or more features 308 extending into a recess 310 of the cup 302. In the example illustrated in FIG. 6C, the one or more features 308 extend below a level 312 at which the metal source material 136 of FIG. 2 is generally maintained, such the one or more features extend into the liquid metal 138. The one or more features 308, for example, comprise an annular ring 316. While not shown, the annular ring or cylinder 316, for example, can extend to a bottom 318 (or proximate to the bottom) of the cup 302, and may optionally comprise radial holes (not shown) in the cylinder, such that when the level 312 of the liquid metal in the cup decreases, contact continues to be made with the cap for additional capillary action, as discussed infra.

Again, a cavity 314 shown in FIG. 6C above the level 312 of the metal source material 136, for example, can be can be further configured to provide head space for vapor pressure to build and subsequently diffuse out of the one or more holes 306 on the cap 304. The respective cap 304, for example is further configured to provide for wicking or capillary action along sidewalls 320 and/or vaporization within the cavity 314.

Figure 7A:
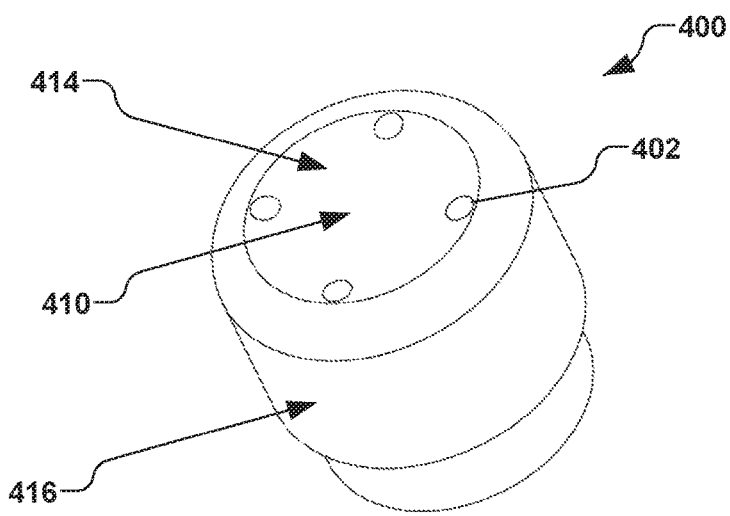
FIG. 7A is a perspective view of a cap for a reservoir apparatus in accordance with various examples of the present disclosure.
Figures 7B, 7C:
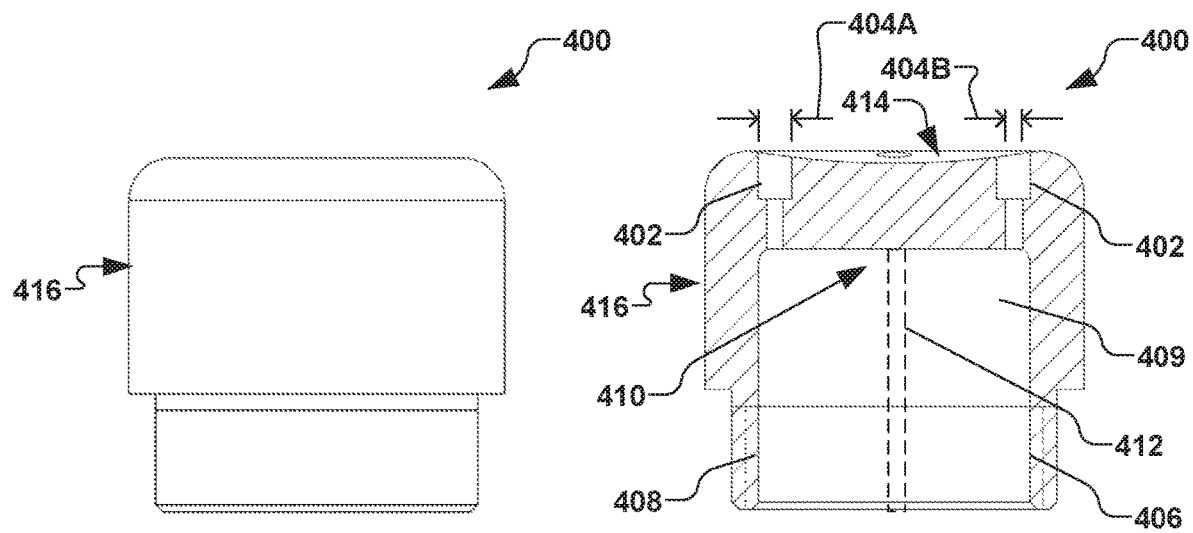
FIG. 7B is a side view of the cap of FIG. 7A in accordance with various examples of the present disclosure.
FIG. 7C is a cross-sectional view of the cap of FIG. 7A in accordance with various examples of the present disclosure.

FIGS. 7A-7C illustrate another example of a cap 400, wherein the cap comprises a plurality of holes 402 having varying diameters 404A, 404B, as well as one or more features 406 (e.g., an annular ring 408) configured to extend below the level of the liquid metal, as described above. As seen in the examples of FIGS. 6C and 7C, the respective cap 304, 400 is configured to cover the cup 302 and provide for wicking along sidewalls 409 and/or vaporization within the cavity between the top of the liquid metal in the cup.

Referring again generally to the example of FIG. 4, when the source material 136 (e.g., originally in solid or powder form) is heated to melt to become the liquid metal 138, the liquefied metal source material is permitted to wick via capillary action to the one or more holes 170 in the cap 168 of the repeller 148. The present disclosure contemplates capillary action, for example, to assist in passing the liquefied metal source material to the one or more holes 170 in the cap 168, whereby the metal source material further transitions to vapor phase. The transition to vapor phase, for example, is achieved by the cap 168 being the hottest surface of the reservoir apparatus 144 due to the ion current induced by the negative bias on the repeller 148.

The present disclosure, for example, provides an introduction apparatus configured to introduce of a liquid metal inside the arc chamber 114 (e.g., proximate to, or in replacement of, the repeller), and electrically biasing the liquid metal to control an amount of power being applied to the liquid metal. At temperatures of approximately 800 C in the arc chamber 114, for example, the vapor pressure is generally too low to sustain plasma for certain metals. However, if the metal is heated to between 1000 C and 1200 C, the vapor pressure may be enough such that the plasma may be attained directly from pure metal (e.g., elemental metal not a metal in a molecular form). Better beam current can thus be attained, as compared to conventional techniques, since only the metal ions are in the plasma (or metal ions when used with a gas such as argon), as opposed to various other constituents of a metal source that is provided in molecular form. Such an apparatus thus provides faster response for turning the system on and off, since the vapor pressure versus temperature curves are generally exponential and the repeller-like structure of the present disclosure has a much smaller thermal mass than a conventional vaporizer. As such, a change in temperature with adequate vapor pressure can be decreased by only 30-50 C, for example, whereby the vapor pressure consequently decreases by one or two orders of magnitude, thus quickly "turning off" the metal vaporization in the arc chamber 114. Such a quick transition can further minimize contamination, as well as having other benefits.

The disclosure presently appreciates that when a surface of the liquid metal is directly exposed to a plasma, it tends to operate in an unstable fashion, whereby vertically high plasma density at one location on the liquid metal locally heats the metal at that location, thus releasing more vapor and making the plasma more dense, and further feeding back on itself, thus leading to quick and unstable heating.

The present disclosure thus provides a reservoir apparatus having a cup or crucible of liquid metal having a cap or lid over the cup, whereby the cap has one or more holes formed therein, such that a region is provided between the liquid metal in the interior of the reservoir apparatus and the volume of the arc chamber for formation of ions. Thus, instead of having only 5-10 hours of operation as seen with previous ion sources for aluminum implants, the liquid metal source of the present disclosure can be stable and run for over 40 hours, while further providing greater beam current than conventional systems.

The present disclosure contemplates two potential mechanisms for vaporization and plasma formation; one mechanism provides pure vaporization of the liquid metal, while the other provides a wicking effect between the liquid metal and the interior surface of the cup (e.g., formed of tungsten) that can take place. By wicking or pulling liquid metal up the sidewalls or features of the cup, and out the holes in the cap by capillary action, once the liquid metal passes through the holes (or slightly before), the liquid metal encounters the plasma and becomes vaporized and goes into the plasma. The present disclosure provides for both the vaporization and wicking as a reaction effect, and recognizes that for various parameters such as a material constituency of the cup and/or cap, the metal source material, the surface treatment of the cup and/or cap, and/or temperature of the reservoir apparatus, the interplay between the vapor and capillary action can differ, whereby said parameters can be tailored for various implant species. For example, changes to the surface structure, texture, material composition, and the area available for wicking, etc. can be modified to control the vaporization and wicking of material to control the plasma, and all such modifications are contemplated as falling within the scope of the present disclosure.

The cap 400 of FIG. 7C, for example, can be configured similar to a candle, whereby a center region 410 of the cap comprises one or more elongate features 412 protruding into the liquid metal contained in the cup (not shown), such that the liquid metal (e.g., liquid aluminum) can be drawn up the one or more elongate features. The one or more elongate features, for example, can comprise one or more of pillars, tubes, rods or other structures.

The respective annular rings 316, 408 of FIGS. 6C and 7C, and/or the one or more elongate features 412 of FIG. 7C can extend proximate to a bottom of the recess in the cup, such that when a level of the liquid metal in the cup decreases, contact continues to be made with the cap for additional capillary action. With such capillary action, modifications such as grooves, changes in the material constituency, or providing sintered materials, etc. can further increase or otherwise vary the capillary effect. Further, a size and number of holes in the cup or cap may be modified to provide various degrees of exposure of the liquid metal or vapor to the plasma. The capillary action, for example, can occur on sidewalls of the cup to the holes in the cap, along one or more pillars extending between the cap and a cavity of the reservoir apparatus and into the liquid metal (e.g., a central structure like a candle or multiple pillars), a cylinder defined in the cap having a lip configured to extend into the cavity, and/or angled holes in the cap, whereby geometries and configurations of the cap and cup provide exposure of the liquid metal through the holes (e.g., wicking up through the holes). Further, the liquid metal may attain vapor phase within the cavity, as well.

The cap 400 of FIGS. 7A-7C, for example, further comprises a convex top 414, whereby the convex top provides for any excess material wicked through the holes 402 to flow towards the center region 410, whereby the excess material can be advantageously vaporized due to higher temperatures present at the center region. By providing the convex top 414, for example, the excess material wicked through the holes 402 is generally prevented from dripping or flowing down sides 416 of the cap 400, thus generally preventing electrical shorting of the cap with other components.

The present disclosure, for example, provides two mechanisms to introduce the one or more source materials from the reservoir apparatus to the arc chamber or ion source; namely, vaporization and capillary action. In the first case, by adjusting the parameters associated with the plasma (e.g., arc current, parameters associated with the source magnet, etc.), or by electrically biasing the repeller, the temperature of the reservoir apparatus can be raised to a vapor range (e.g., 1000 C-1200 C) to provide a vapor pressure sufficient to adequately operate the ion source. The reservoir apparatus of the present disclosure further advantageously provides that when the input power to the ion source is reduced, for example, the temperature of the reservoir apparatus quickly decreases, whereby a temperature drop of only a few tens of degrees is sufficient to reduce the vapor pressure times by an order of magnitude or more, such that the loss of material is minimized and cross-contamination eliminated. The vaporization action can be thus controlled, for example, by controlling heat inputs and losses to the reservoir apparatus and the conductance between reservoir apparatus and arc chamber of the ion source.

In accordance with another example of the present disclosure, capillary action can be utilized such that liquid material is drawn up sidewalls or features associated with the reservoir apparatus, whereby the liquid material passes through the holes in the cap, thus exposing the liquid material to the plasma, whereby the liquid material is vaporized by the plasma. The rate of such capillary action or "wicking", for example, can be affected or otherwise controlled by an interior surface area of reservoir apparatus, a presence or absence of features such as pillars, tubes, or a central wick or other features associated with the cap, surface treatments of one or more of the cup and cap such as a provision of grooves or striations in surface(s) thereof, and material selection of the various features of the cup and cap.

Interplay between vaporization and capillary actions associated with one or more of the cup and cap, for example, can be thus varied by geometries, material selections, surface treatments, or other considerations such as the cap being formed with central and outer regions having different thermal characteristics. A reservoir apparatus comprised of (or comprising) tungsten, for example, can be well-suited for use with a metal source material such as liquid aluminum. The present disclosure further contemplates other refractory materials such as molybdenum, graphite, boron nitride, aluminum nitride, alumina, and tantalum alternatively being used in the formation of the reservoir apparatus.

A volume of metal source material that can be held or retained within the reservoir apparatus inside the arc chamber, for example, is generally limited by the geometry of the arc chamber. The volume of source material provided within the reservoir apparatus, for example, can be increased or supplemented by providing an auxiliary supply (e.g., an accessory reservoir, tank, or other volume) in fluid communication with the reservoir apparatus within the arc chamber, whereby the auxiliary supply provides a larger volume of the metal source material to the cup of the reservoir apparatus through a conduit, such as a tube. The auxiliary supply, for example, is configured to maintain a temperature of the metal source material above the melting point of the metal source material by heat gleaned from the plasma chamber and/or an external heater.

According to another example, the reservoir apparatus of the present disclosure is suitable for providing an ion beam current of 10 mA of Ga+ and Al ion beam currents of >2 mA Al+ and 1 mA Al++ for a period of greater than 40 hours in an ion source, whereby the ion source utilizing the reservoir apparatus can be advantageously operated for greater than 40 hours without substantial maintenance. For comparison, operation of a conventional ion source utilizing AlN sputter targets inside of the arc chamber provide typical lifetimes of approximately 10 hours, whereby the lifetimes are often limited by depositions formed on the ion source extraction electrodes.

In another example, the ion source of the present disclosure can be configured for implantation of gallium ions, whereby the metal source material comprising liquid gallium is contained in a reservoir apparatus provided as a repeller in the ion source. The repeller, for example, is biased more negative than the cathode such that energy transferred from the plasma to the metal source material can be increased and controlled. As such, the temperature of the metal source material can be advantageously increased to 1300K-1400K, which for gallium, will result in a vapor pressure being high enough to sustain the plasma. The present disclosure further appreciates that various other metal source materials can benefit from such a heating of the repeller cup, and contemplates all such materials as falling within the scope of the present disclosure.

For example, calculations show that gallium has a vapor pressure of approximately 1 mtorr at 1200K and 10 mtorr at 1320K. In isolated repeller structures, for example, can attain temperatures of approximately 1000 C, whereby further biasing the repeller more negative than the cathode can achieve these increased temperatures for desired vapor pressures.

For the area of gallium required, if the source and target were in equilibrium at 1300K, then kinetic theory says, for 8 mtorr pressure:

Number density in gas of gallium atoms=$5.9 \times 10^{19}$ m$^{-3}$.

$$\frac{n}{4}\sqrt{\frac{8KT}{\pi m}} = \frac{5.9 \times 10^{19}}{4}\sqrt{\frac{8 \cdot 1.38 \times 10^{-23} \cdot 1300}{pi \cdot 70 \cdot 1.67 \times 10^{-27}}}, \quad (1)$$

where the Flux=$9.2 \times 10^{21}$ atoms/m$^2$/s, which equals $5.5 \times 10^{23}$ atoms/m$^2$/min, 0.92 mol/m$^2$/min, or 20600 sccm/m$^2$. Thus, in order to maintain a flow of 5 sccm for an exemplified implant, an area of $2.4 \times 10^{-4}$ m$^2$, or a square 15 mm per side would be considered reasonable.

For next generation of PMOS S/D, for example, it is appreciated that low contact resistance can be realized by using gallium doping. Gallium-69, for example, is a metal that has the melting point of 302.91° K (29.76° C. or 85.57° F.). Gallium-69, for example, is generally in a liquid state at temperatures just above room temperature. A gas such as argon, for example, may be used as the source gas to generate the required temperature to vaporize the gallium.

The liquid metal in the reservoir apparatus, for example, can remain in liquid state as it is heated by the plasma in the arc chamber, and the amount of heating can be modified by changing or controlling the density of the plasma, changing or controlling the arc current, and/or by changing or controlling the parameters of the source magnet. In the case of the cap and cup taking the form of a repeller, such a control can concentrate the plasma onto the repeller to further control its heating. Further, a radiation shield (not shown) may be utilized around the cap and cup to make it hotter or otherwise control heating. Additionally, notches and/or grooves may be implemented in a stem portion extending from the cup to reduce thermal losses, where the stem is held in a clamp that has a cross section that could be similarly configured to reduce or control heat transfer.

In another example, a center of the cap can have a greater thickness where ion bombardment occurs. The densest part of the plasma column, for example, is where most of the ions are striking and sputtering, whereby the repeller can be further biased to different voltages to increase or decrease the energy of the ion strike to the surface thereof to further control the heating of the repeller. By biasing the cap by the repeller power supply shown in FIG. 2, for example, power may be almost instantaneously electrically controlled to control an amount of power applied to the repeller and cap and/or cup.

The configuration, size, number, location, etc. of the holes in the cap can be modified, as well as the number and configuration of the cylinder, pillars, or other features can be modified to suit particular needs of particular implants. As discussed above, the present disclosure, for example, provides a wicking of the liquid metal from the cup to a location where the liquid metal meets the plasma. By controlling the material temperature, for example, a flow rate of the wicking of the liquid metal may be adjusted such that a constant source of the liquid metal can be provided into the plasma to maintain or control the plasma. For example, the metal can wick from the cup to the hole and to the exterior surface of the cap, and then be vaporized by facing the full force of the plasma.

The present disclosure further appreciates that direct vaporization, such as for gallium implants, may be achieved, whereby temperatures of approximately 1100 C allow the vapor pressure, alone, to sustain the plasma. In such a case, while wicking may still be achieved, it may not be necessary, as vaporization of the liquid metal in the cup may permit the vaporized metal to "leak" through the holes. For example, as illustrated in FIGS. 9A-9C showing a cap over a sidewall (with no features extending into the cup, a volume inside the cup is increased as much as possible with the sidewalls, whereby the cavity defined therein has head space to contain some vaporized metal.

In some experiments, over 100 hours of operation have been attained using the liquid metal provisions described herein. Further, when the repeller apparatus (e.g., the cup and cap) is provided at the bottom of an ion source arc chamber in a vertical orientation shown in FIG. 2, for example, gravity can provide further advantages, as the cup may be simply supported by conventional techniques at the bottom of the arc chamber, thus providing an ample-sized reservoir for the liquid metal. However, the present disclosure further contemplates providing an external reservoir that is operably coupled or connected to a cap-like structure within the arc chamber, such as through tubing or other conduit. For example, as long as the external reservoir is maintained above the melting point of the metal, the liquid metal can be fed into the arc chamber in a variety of manners, thus potentially extend a lifetime of the components of the arc chamber even further. Likewise, a constant level of liquid metal may be further kept in the cup by Archimedes Principle, whereby liquid metal may be fed into the reservoir apparatus to extend the operation time of the arc chamber. An auxiliary reservoir, for example, may be provided around the arc chamber (e.g., maintained at 600-700 C), and kept at a temperature to maintain the metal in a liquid phase. The present disclosure appreciates that gallium melts at room temperature, while indium melts at 130 C, so varying degrees of active heating may be provided, as well.

The present disclosure further appreciates that the liquid metal may be provided to the arc chamber in other manners, and does not necessarily provide the introduction via a repeller. For example, the present disclosure contemplates any biased or non-biased structure in the arc chamber configured to provide liquid metal to the interior of the arc chamber. For example, in some ion sources, the ion source arc chamber is provided in a horizontal position, whereby wicking action may be implemented by an apparatus of the present disclosure to supply the liquid metal, and/or heat the liquid metal to provide the metal vapor. Such an apparatus, for example, could be positioned on a side of the ion source (e.g., when the arc chamber is horizontally oriented), whereby a heat source may be provided to the apparatus (e.g., a heater may be supplied around the apparatus). Further, if a horizontal structure is provided, the cup can be oriented, for example, such that gravity holds the liquid metal in the cup, whereby the cap can be angled with respect to the cup (e.g., at 90 degrees or other angle), whereby wicking action and/or direct vaporization may also be attained. A showerhead—style or other configuration may be similarly provided on the side of the arc chamber.

Again, while a repeller is provided in several examples of the present disclosure, the concepts of the present disclosure are not limited to repeller. Further, by controlling the material choices, temperature, and configurations discussed herein, the liquid metal is not necessarily exposed to the plasma at all times. If a bath of liquid metal is positioned along the side of the ion source, the liquid metal may be exposed to the plasma whenever the plasma is active. The present disclosure further provides an ability to turn on and off the exposure of the liquid metal to the plasma. The present disclosure, for example, thus provides a reservoir or other apparatus to supply liquid metal to the interior region of the ion source.

Figure 8:
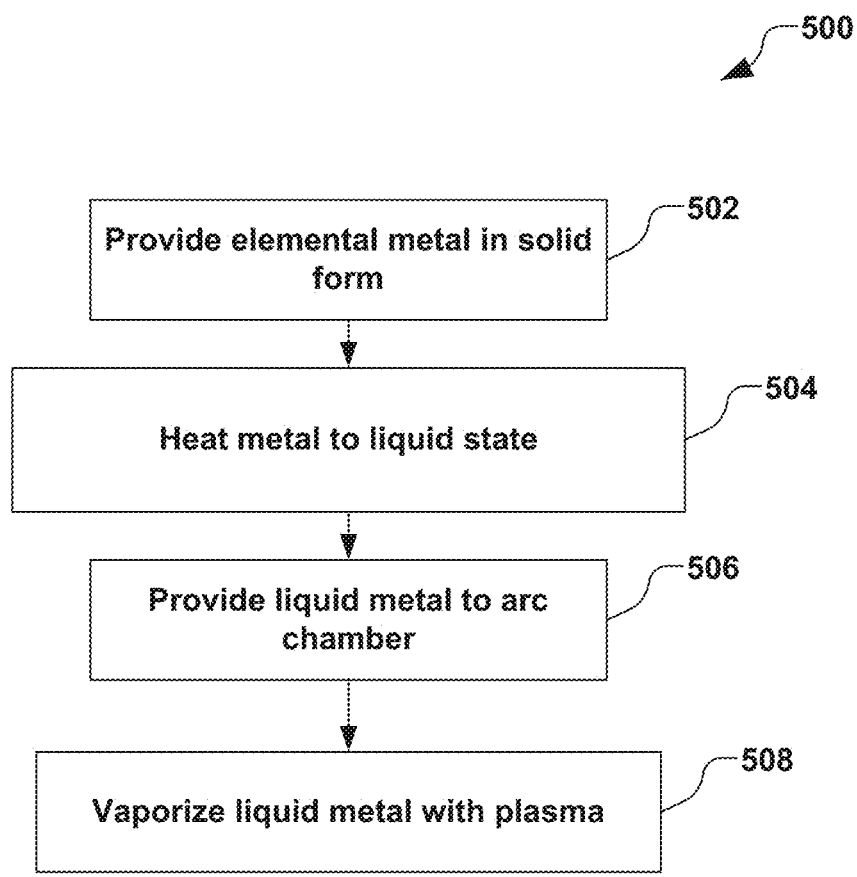
FIG. 8 is a flowchart illustrating an example method for forming ions from a liquid metal source according to another example of the present disclosure.

In accordance with another exemplary aspect, a method 500 is provided in FIG. 8 for providing a liquid metal to an ion source for forming an ion beam for an ion implantation into a workpiece. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

It should be noted that the controller 134 of FIG. 1 may be configured to perform the method 500 of FIG. 8, whereby control of various components discussed above may be achieved in the manner described herein. As illustrated in FIG. 8, the exemplified method 500 begins at act 502, wherein a metal, such as a metal in elemental form, is provided to an ion source in solid form. The metal can be in a powder or other solid form. The metal, for example, is provided to a cup of a reservoir apparatus positioned inside an arc chamber, as described above in several examples.

In act 504, the metal is heated to a liquid state, and in act 506, the liquefied metal is provided to an interior region of the arc chamber. Acts 504 and 506 may be performed sequentially or concurrently in various orders. In one example, the metal may be heated to the liquid state external to the arc chamber in act 504 and subsequently provided to the interior region of the arc chamber in act 506. In act 508, the liquid metal is vaporized to form a plasma.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion source configured to form an ion beam, the ion source comprising:
   an arc chamber generally enclosing an arc chamber environment;
   a reservoir apparatus configured to provide a liquid metal to the arc chamber environment, wherein the reservoir apparatus comprises:
   a cup having a recess configured to generally contain the liquid metal therein; and
   a cap, wherein the cap is in selective engagement with the cup and generally encloses a top portion of the reservoir apparatus, therein defining a reservoir environment associated with the liquid metal, and wherein the cap further comprises one or more features extending into the recess, wherein the one or more features are configured to contact the liquid metal within the recess and to feed the liquid metal toward the arc chamber environment via capillary action; and
   a biasing power supply configured to electrically bias the reservoir apparatus with respect to the arc chamber.

2. The ion source of claim 1, wherein the cup is configured to generally contain the liquid metal therein by gravity.

3. The ion source of claim 1, wherein the liquid metal resides in the reservoir environment, and wherein the reservoir apparatus is further configured to selectively evaporate at least a portion of the liquid metal therein.

4. The ion source of claim 3, wherein the reservoir apparatus is configured to selectively evaporate the at least a portion of the liquid metal by a selective heating of the reservoir apparatus via a heat source.

5. The ion source of claim 4, wherein the heat source comprises one or more of a plasma generated within the arc chamber, an energy associated with ions from the plasma striking the reservoir apparatus, and an auxiliary heater.

6. The ion source of claim 1, wherein the cap comprises one or more holes defined therein, wherein the one or more holes provide fluid communication between the reservoir environment and the arc chamber environment.

7. The ion source of claim 1, wherein the one or more features comprise one or more of a predetermined surface area, surface roughness, and surface material configured to provide the capillary action.

8. The ion source of claim 1, wherein the one or more features comprise one or more of an annular feature extending from the cap into the recess, a reservoir feature extending from the recess toward the cap, and an elongate feature extending from a central portion of the cap into the liquid metal within the recess.

9. The ion source of claim 1, wherein the liquid metal is comprised of one of aluminum, gallium, and indium.

10. An arc chamber for forming an ion beam, the arc chamber comprising:
    a housing generally enclosing an arc chamber environment;
    a reservoir apparatus positioned within the arc chamber environment, wherein the reservoir apparatus is configured to contain a liquid metal in the arc chamber environment, wherein the reservoir apparatus comprises a cup and a cap, wherein the cup has a recess configured to at least partially contain the liquid metal therein, and wherein the cap is in selective engagement with the cup and generally encloses a top portion of the reservoir apparatus, therein defining a reservoir environment associated with the liquid metal, wherein the liquid metal resides in the reservoir environment, and wherein the reservoir apparatus is further configured to selectively evaporate at least a portion of the liquid metal therein, wherein the cap comprises one or more features extending into the cup, wherein the one or more features are configured to contact the liquid metal within the recess and to feed the liquid metal toward the arc chamber environment via capillary action; and a biasing power supply configured to electrically bias the reservoir apparatus and to form a plasma within the arc chamber environment.

11. The arc chamber of claim 10, wherein the reservoir apparatus is configured to selectively evaporate the at least a portion of the liquid metal by a selective heating of the reservoir apparatus via a heat source, wherein the heat source comprises one or more of the plasma generated within the arc chamber, an energy associated with the ion beam, and an auxiliary heater.

12. The arc chamber of claim 11, wherein the cap comprises one or more holes therein, wherein the one or more holes provide fluid communication between the reservoir environment and the arc chamber environment, and wherein the one or more holes have one or more diameters, and wherein the one or more holes are oriented such that the plasma in the arc chamber does not have direct contact with the liquid metal in the recess.

13. The arc chamber of claim 10, wherein the one or more features comprise an annular ring defined in the cap, wherein the annular ring extends from a main portion of the cap into the liquid metal within the recess.

14. The arc chamber of claim 10, wherein the one or more features comprise an elongate feature extending from a main portion of the cap into the liquid metal within the recess.

15. The arc chamber of claim 10, wherein the cap comprises one or more holes therein, wherein the one or more holes provide fluid communication between the reservoir environment and the arc chamber environment, and wherein the one or more holes have one or more diameters, and wherein the one or more holes are oriented such that the plasma in the arc chamber does not have direct contact with the liquid metal in the recess.

16. An arc chamber for forming an ion beam, the arc chamber comprising:

a housing generally enclosing an arc chamber environment;

a reservoir apparatus configured to contain a liquid metal in the arc chamber environment, wherein the reservoir apparatus comprises:
 a cup having a recess configured to at least partially contain the liquid metal therein;
 a cap in selective engagement with the cup and generally enclosing a top portion of the reservoir apparatus; and
 one or more features associated with one or more of cup and cap and configured to contact the liquid metal within the recess and to feed the liquid metal toward the arc chamber environment via capillary action; and a biasing power supply configured to electrically bias the reservoir apparatus and to form a plasma within the arc chamber environment.

17. The arc chamber of claim 16, wherein the one or more features comprise one or more of an elongate feature and an annular ring, wherein the elongate feature extends from a main portion of the cap into the liquid metal within the recess, and wherein the annular ring is defined in the cap, wherein the annular ring extends from a main portion of the cap into the liquid metal within the recess.

18. The arc chamber of claim 16, wherein the one or more features comprise one or more of a predetermined surface area, surface roughness, and surface material configured to provide the capillary action.

19. The arc chamber of claim 16, wherein the one or more features comprise one or more of an annular feature extending from the cap into the recess, a reservoir feature extending from the recess toward the cap, and an elongate feature extending from a central portion of the cap into the liquid metal within the recess.

20. The arc chamber of claim 16, wherein the cap comprises one or more holes defined therein, wherein the one or more holes provide fluid communication between a reservoir environment associated with the cup and the arc chamber environment.

* * * * *